(12) United States Patent
Zhang

(10) Patent No.: US 6,335,540 B1
(45) Date of Patent: *Jan. 1, 2002

(54) SEMICONDUCTOR DEVICE AND PROCESS FOR FABRICATING THE SAME

(75) Inventor: Hongyong Zhang, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/252,000

(22) Filed: Feb. 18, 1999

Related U.S. Application Data

(62) Division of application No. 08/888,295, filed on Jul. 3, 1997, now Pat. No. 5,886,364, which is a continuation of application No. 08/562,357, filed on Nov. 22, 1995, now abandoned, which is a continuation of application No. 08/263,433, filed on Jun. 21, 1994, now abandoned.

(30) Foreign Application Priority Data

Jun. 24, 1993 (JP) .............................................. 5-177408

(51) Int. Cl.⁷ .............................................. H01L 29/04
(52) U.S. Cl. .............................. 257/53; 257/72; 257/659
(58) Field of Search ........................ 257/659, 59, 72, 257/435, 53

(56) References Cited

U.S. PATENT DOCUMENTS

| | | | |
|---|---|---|---|
| 4,609,930 A | 9/1986 | Yamazaki | 257/435 |
| 4,748,485 A | 5/1988 | Vasudev | 357/23.7 |
| 4,984,033 A | 1/1991 | Ishizu et al. | 357/17 |
| 4,996,575 A | 2/1991 | Ipri et al. | 357/23.7 |
| 5,064,775 A | 11/1991 | Chang | 437/40 |
| 5,130,264 A | 7/1992 | Troxell et al. | 437/40 |
| 5,185,535 A | 2/1993 | Farb et al. | 257/351 |
| 5,233,211 A | 8/1993 | Hayashi et al. | 257/659 |
| 5,237,196 A | 8/1993 | Mikata et al. | 257/409 |
| 5,245,201 A | 9/1993 | Kozuka et al. | 257/53 |
| 5,294,821 A | 3/1994 | Iwamatsu | 257/351 |
| 5,352,907 A | 10/1994 | Matsuda et al. | 257/72 |
| 5,506,436 A | 4/1996 | Hayashi et al. | 257/351 |
| 5,672,518 A | 9/1997 | Hayashi et al. | 437/2 |
| 5,759,878 A | 6/1998 | Hayashi et al. | 438/151 |
| 5,807,772 A | 9/1998 | Takemura | 438/157 |
| 5,886,364 A * | 3/1999 | Zhang | 257/53 |
| 5,917,221 A | 6/1999 | Takemura | 257/365 |
| 5,926,699 A | 7/1999 | Hayashi et al. | 438/151 |
| 6,040,200 A | 3/2000 | Hayashi et al. | 438/30 |

FOREIGN PATENT DOCUMENTS

| | | |
|---|---|---|
| JP | 61-220371 | 9/1986 |
| JP | 62-117359 | 5/1987 |
| JP | 64-008671 | 1/1989 |
| JP | 64-019761 | 1/1989 |
| JP | 02-015676 | 1/1990 |
| JP | 04-152574 | 5/1992 |

* cited by examiner

Primary Examiner—Mark V. Prenty
(74) Attorney, Agent, or Firm—Eric J. Robinson; Nixon Peabody LLP

(57) ABSTRACT

An electro-optical device such as a liquid crystal device comprises a transparent substrate and a plurality of thin film transistors for driving pixel electrodes. In order to prevent an undesirable influence of light incident on the thin film transistors, a light shielding layer is interposed between the thin film transistors and the transparent substrate. Another portion of the light-shielding layer which corresponds to the pixel electrodes, has been changed to transparent by selectively oxidizing or nitriding the layer.

40 Claims, 4 Drawing Sheets

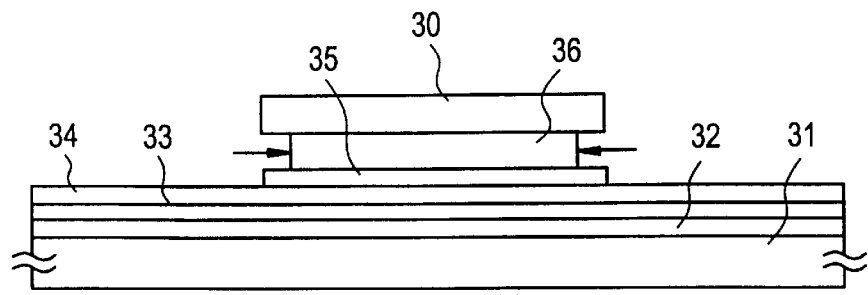
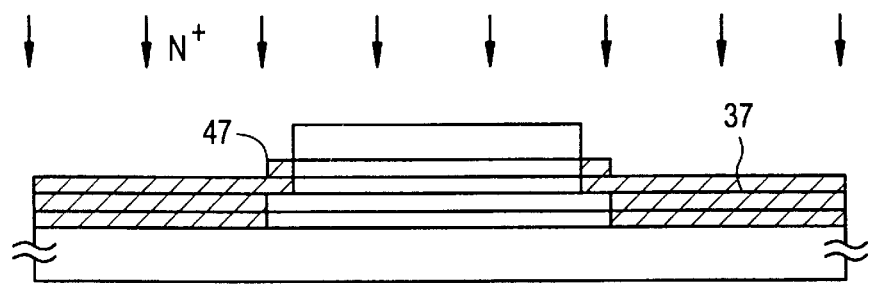
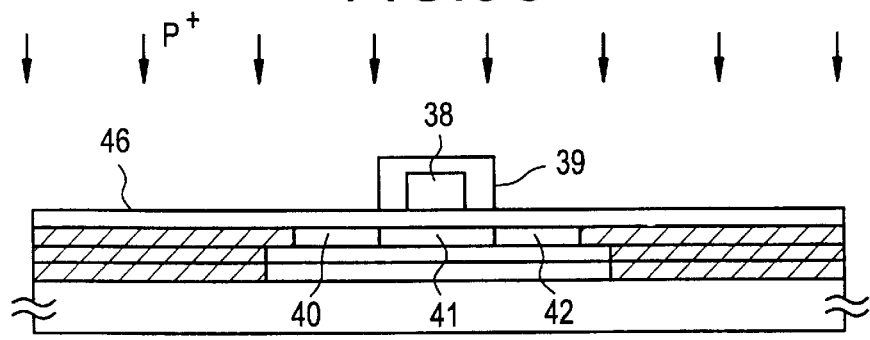
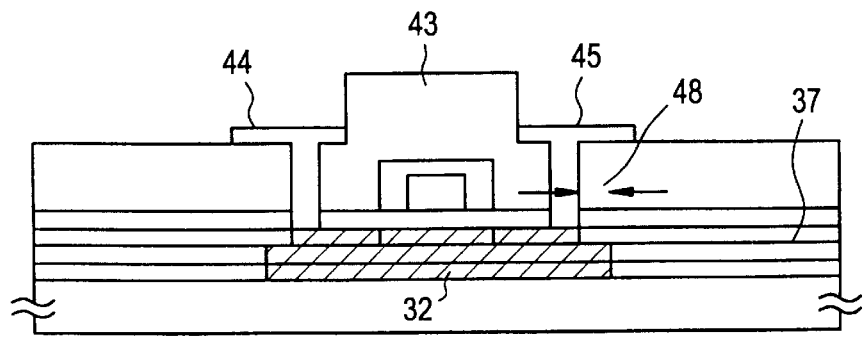

SEMICONDUCTOR DEVICE AND PROCESS FOR FABRICATING THE SAME

This application is a divisional of application Ser. No. 08/888,295, filed on Jul. 3, 1997 and now U.S. Pat. No. 5,886,364, which is a continuation of application Ser. No. 08/562,357, filed Nov. 22, 1995, now abandoned, which is a continuation application of application Ser. No. 08/263,433, filed Jun. 21, 1994, now abandoned.

BACKGROUND OF THE INVENTION

1. Field of the Invention

The present invention relates to a semiconductor device comprising a thin film transistor (hereinafter referred to simply as a "TFT"), and to a process for fabricating the same.

2. Prior Art

Thin film transistors have been applied heretofore to active-matrix addressed liquid crystal display devices or to image sensors. In particular, the active matrix liquid crystal display devices using TFTs as switching elements, i.e., those comprising TFTs being formed in each of the pixels, are attracting much attention as liquid crystal display devices capable of operating at high speed.

As is well known, light must be transmitted through the pixel portions of a liquid crystal display device. However, the electric conductivity of the active layer of a TFT increases as light is irradiated thereto, because the active layers are made of a film of amorphous silicon or crystalline silicon which is usually photosensitive. The increase in conductivity of an active layer then unfavorably impairs the charge retention of a pixel electrode, because the off current, which is an important characteristic of a TFT switching element, is increased by the irradiation of light. Accordingly, it is necessary to establish a special constitution for the TFT, i.e., a constitution in which light is not irradiated to the active layer, and particularly, in which the channel-forming region of the active layer is isolated from light.

SUMMARY OF THE INVENTION

In the light of the aforementioned circumstances, the primary purpose of the present invention is to provide a structure in which a TFT is protected from light entering from outside in order to reduce an Ioff current of the TFT.

In accordance with a first aspect of the invention, a light-blocking (light shielding) film is interposed between a TFT and a light transparent substrate. More specifically, the light-blocking film comprises such a material which is capable of being changed to a light-transparent film upon oxidation or nitridation. Therefore, the unnecessary portion of the light-blocking film which is not located under the TFT but is selectively converted to light transparent without using a complicated photolithography process for pattering the light-blocking film.

Accordingly, the light blocking film prevents the TFT from being undesirably irradiated with light entering from a transparent substrate while the other portions of the light blocking film are changed to be transparent so that the device can operate as an electro-optical display device. The present invention is applicable not only to an active matrix liquid crystal device in which TFTs are provided on a pixel area of a transparent substrate or an image sensor, but also to an integrated circuit which employs TFTs formed on a transparent substrate.

In accordance with a first aspect of the invention, the light-blocking layer in the present invention comprises a material selected from the group consisting of silicon and aluminum, for example. These materials are light-shielding but can be made transparent upon oxidation or nitridation. Further, it is preferable to dope the silicon with an appropriate impurity, for example, phosphorous, arsenic, boron, aluminum or other IIIb or Vb group elements.

In accordance with another aspect of the invention, a semiconductor island which forms source, drain and channel regions therein has its peripheral portion nitrided or oxidized. Thereby, it is possible to prevent a leak current or short circuit which tends to occur between a gate electrode and the channel region through a gate insulating layer at side edges of the semiconductor island due to a stepped configuration of the semiconductor island.

The present invention will be described below in more detail in conjunction with the attached figures. It should be understood, however, that the present invention is not to be construed as being limited thereto.

BRIEF DESCRIPTION OF THE DRAWINGS

FIGS. 3A–3D are schematic cross-sectional views showing a manufacturing process of a TFT in accordance with a second embodiment of the invention.

DETAILED EMBODIMENT OF THE INVENTION

Figure 1A:
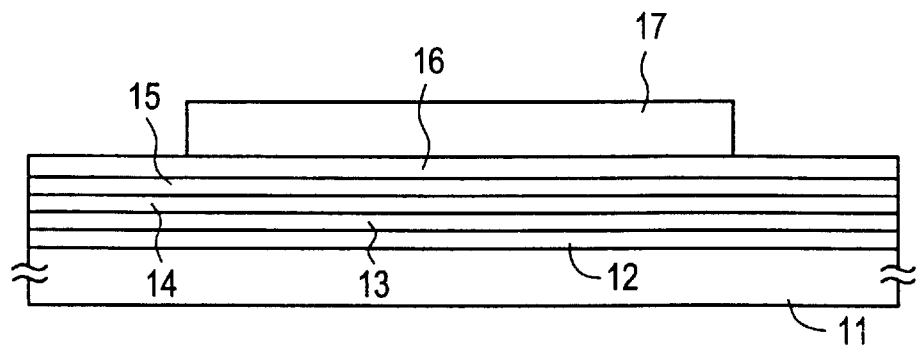
FIGS. 1A–1G are schematic cross-sectional views showing a manufacturing process of a TFT in accordance with a first embodiment of the invention.

A typical example of the structure of the present invention will be described in reference to FIG. 1G. Referring to the TFT shown in FIG. 1G, an amorphous silicon film 12 doped with phosphorous is formed under the lower side of an active layer comprising source/drain regions 22 and 24 and a channel region 23, and light is irradiated from the substrate side. Thus, the amorphous silicon film 12 functions as a light shield to shut off the light irradiated from the substrate side. The shaded region other than the active area is nitrided or oxidized to impart light transmitting properties thereto. The active region is surrounded by a nitrided or an oxidized portion 28, and the light shielding layer also extends thereunder, the active layer is completely shielded from light.

The use of a nitrided or oxidized silicon film yields the following effects:

(1) the TFT can be completely shielded from incident light irradiated from the substrate side;
(2) the channel forming region can be fixed at the ground level because the phosphorous doped silicon film is electrically conductive;
(3) the impurities from the substrate side can be blocked; and
(4) metal elements such as nickel can be gettered.

Another typical example of the present invention is described below referring to FIG. 3D. In this TFT again, light is irradiated from the substrate side (the lower side of the figure). Referring to FIG. 3D, an aluminum film 32 is provided to the lower portion of the active layer in which source/drain regions 40 and 42, and a channel forming region 41 is formed. The aluminum film shields the active layer from light passing through the substrate. Nitrogen or oxygen atoms are implanted into the regions other than the region corresponding to the active layer in order to render those regions transparent by forming aluminum nitride or aluminum oxide. Since the aluminum film 32 is extended to the peripheral portion (as indicated with reference numeral 48) around the active layer, light path to the active layer from the glass substrate 31 is cut off completely.

The use of a nitrided or oxidized aluminum film yields the following effects:

(1) the TFT can be completely shielded from incident light irradiated from the substrate side; and (2) the film functions as a heat sink to stabilize the operation of a TFT.

EXAMPLE 1

Referring to FIGS. 1A–1G, the present example provides a process for fabricating an N-channel TFT according to an embodiment of the present invention. A P-channel TFT can be fabricated in the same manner by modifying the source/drain regions into P-type conductive source/drain regions. Furthermore, a P-channel TFT and an N-channel TFT can be formed in a complementary configuration to provide a CMOS circuit. The TFT according to the present example can be used in an active-matrix type liquid crystal display device or in an image sensor. Furthermore, it can be used in an integrated circuit formed on a light-transmitting substrate.

According to the process of the present example, an amorphous silicon film 12 doped with phosphorous is formed at a thickness of 200–500 Å on a glass substrate 11. The silicon film absorbs light and functions mainly as a light shield. The concentration of phosphorous contained in the amorphous silicon is $1\times10^{19}$ atoms/cm$^3$–$5\times10^{21}$ atoms/cm$^3$, preferably, $1$–$5\times10^{20}$ atoms/cm$^3$. The doped amorphous silicon film is electrically conductive, and hence, it maintains the potential of the region in which the channel is formed later at a ground level.

Then, an insulating film such as a silicon oxide film 13 is deposited by sputtering to a thickness of 500 Å (generally in the range of from 300 to 600 Å). An amorphous silicon film 14 is then deposited to a thickness of 1,000 Å (generally in the range of from 500 to 1,500 Å) by plasma CVD. The amorphous silicon film 14 functions as an active layer of the TFT. If necessary, the amorphous silicon film may be crystallized to provide a crystalline silicon film 14. The crystalline silicon film 14 can be obtained by thermally annealing the amorphous silicon film, by irradiating a laser beam to the amorphous silicon film, or by initially forming a crystalline silicon film. It is also useful to further anneal the thermally crystallized silicon film by irradiating an infrared radiation thereto. Furthermore, it is preferable to add a catalytic element such as nickel into the amorphous silicon 14 before heat crystallizing in order to lower the crystallization temperature.

A silicon oxide film 15 is then further deposited by sputtering at a thickness of 500 Å (generally in the range of from 200 to 1,000 Å). A 2,000 Å thick (generally from 2,000 to 3,000 Å thick) aluminum film 16 is formed thereafter by vapor deposition. A mask is further formed thereon using a resist 17 to obtain a structure as shown in FIG. 1A.

Figure 1B:
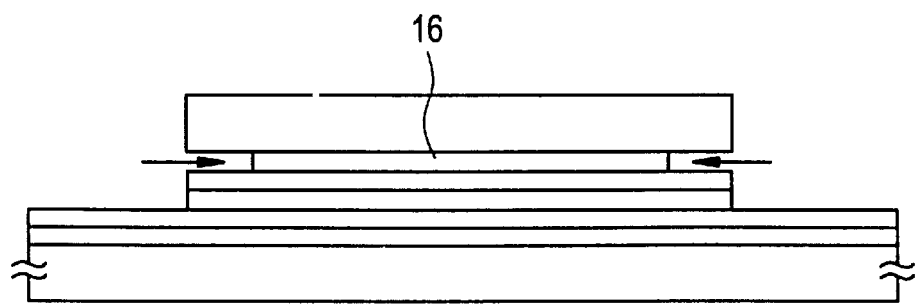

The aluminum film 16, the silicon oxide film 15, and the silicon film 14 are etched by using the resist 17 as the mask to obtain an island-like laminate. The aluminum film 16 is side-etched thereafter as shown in FIG. 1B by means of isotropic dry etching. The side etching is effected to leave a light shielding layer in a marginal portion 48 in the final product shown in FIG. 1G.

The resist 17 is removed thereafter to introduce nitrogen by ion implantation. The aluminum film 16 functions as a mask for introducing nitrogen inside the hatched portion 18. Annealing is effected thereafter to impart light-transmitting properties to the nitrogen-implanted region by nitridation. The annealing step is preferably effected by irradiating an intense light (infrared radiation). An infrared radiation is selectively absorbed by silicon and not by the glass. Accordingly, the temperature of silicon can be selectively elevated to a value as high as 1,000° C. or even higher so that an effect well comparable to that of thermal annealing at 1,000° C. can be obtained.

Figure 1C:
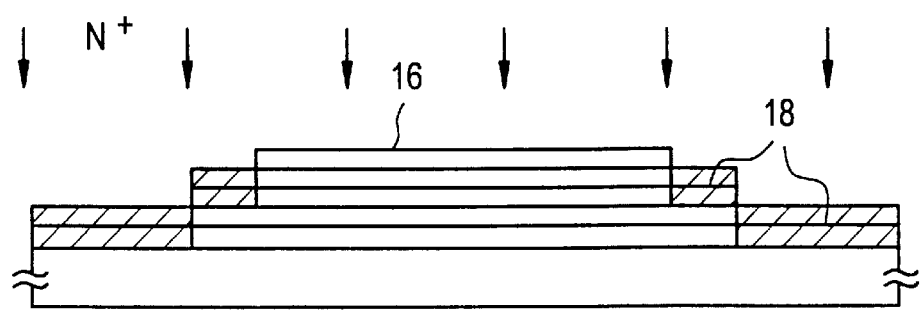
Figure 1D:
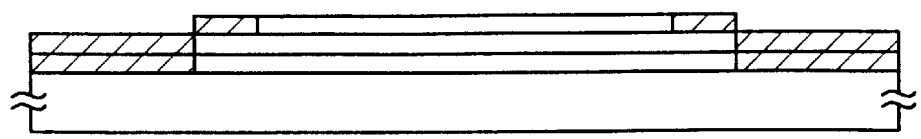

In the above step, the portion of the phosphorous doped silicon film 12 in which the nitrogen is implanted becomes transparent. That is, the hatched portion shown in FIG. 1(C) is subjected to nitriding to provide a light-transmitting region. The silicon oxide film 15 and the aluminum film 16 are removed thereafter to obtain a structure as shown in FIG. 1D. Thus, a light-shielded active region surrounded by a nitride portion can be established while rendering the other region light-transmittable.

Figure 1E:
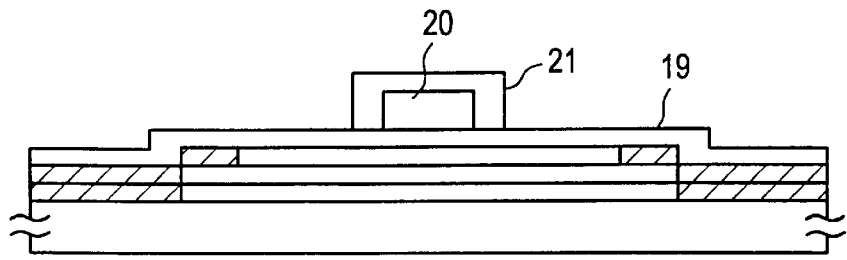

Referring to FIG. 1E, another silicon oxide film 19 is formed thereafter at a thickness of 1,000 Å by sputtering. The silicon oxide film thus obtained functions as a gate insulation film. An aluminum film containing 1 to 2% silicon is formed thereafter at a thickness of 6,000 Å and patterned to obtain a gate electrode 20. An anodic oxide layer 21 is formed around this aluminum gate electrode to a thickness of 2,000 Å. This step of anodic oxidation is effected in an ethylene glycol solution containing from 1 to 5% tartaric acid. The anodic oxide layer 21 functions as a mask in forming an offset gate region in the later step of implanting phosphorus ion. Thus is obtained a structure illustrated in FIG. 1E.

The gate electrode may be of a known type containing silicon as the principal component, a laminate of silicon and a metal, or may be a silicide.

Figure 1F:
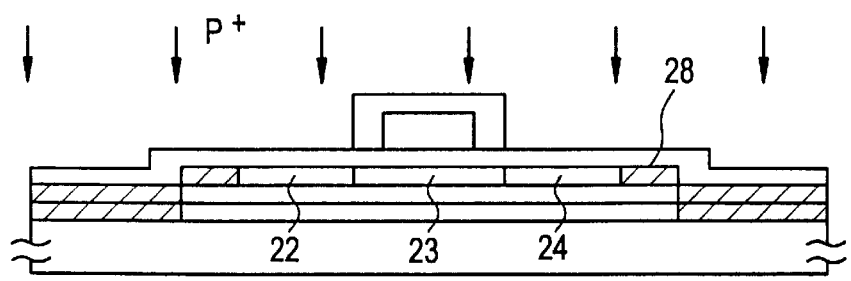

Phosphorus ions are selectively introduced into the semiconductor layer by ion implantation thereafter as shown in FIG. 1F. Thus, source/drain regions 22 and 24, which were rendered N-type, and a channel forming region 23 are formed in a self-aligning manner. A laser beam or an intense light is irradiated to the resulting structure to activate the implanted phosphorus and to effect annealing. In the case of using an intense light, an infrared light having a wavelength in the range of from 0.5 to 5 $\mu$m is desirable. Further, the heat annealing by the intense light is carried out in a short time, preferably within a few minutes.

Figure 1G:
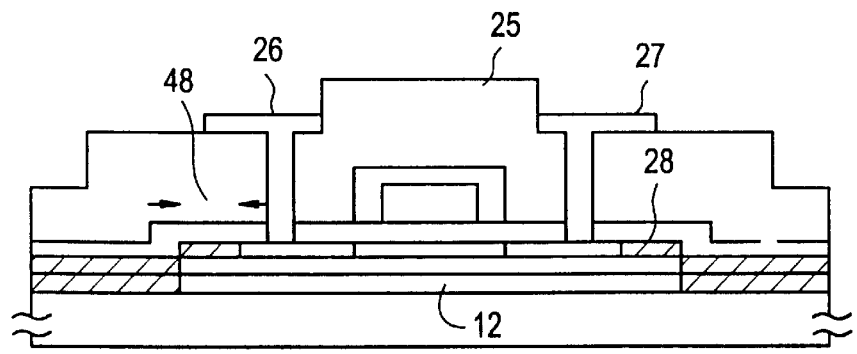

An interlayer insulating film 25 is then formed with silicon oxide or polyimide and further electrodes 26 and 27 are formed as shown in FIG. 1G. Thus, a TFT is completed.

Figure 2:
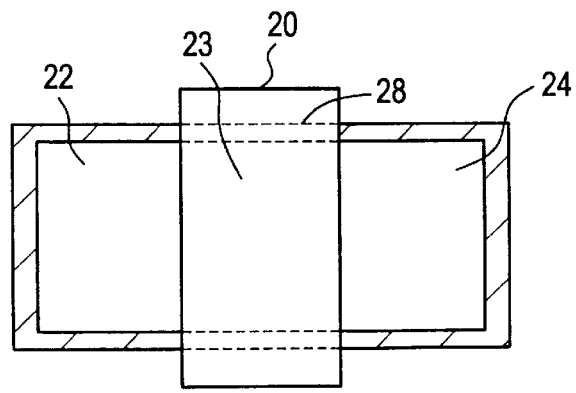
FIG. 2 shows a plane view showing a TFT obtained in accordance with a first embodiment of the invention.

In the TFT illustrated in FIG. 1G, the active layer comprising source/drain regions 22, 24 and a channel forming region 23 is surrounded by a peripheral portion 28 into which nitrogen is implanted and nitrided. Thus, the problems of short circuit and current leakage between a gate electrode and an edge of the active layer can be reduced. This feature is shown in FIG. 2, in which a planar view as seen from the upper side of the TFT of FIG. 1G is illustrated. It can be seen that a channel forming region 23 is formed under the gate electrode 20. In the prior art in which there is no peripheral nitrided film 28, the thickness of the gate insulating layer is not enough at the side edges of the semiconductor layer because of a stepped configuration, and therefore, there is a problem that a leak current or short circuit occurs there between the gate electrode 20 and channel region 23. However, according to the present invention, the nitride 28 formed around the edges of the active layer prevents problems such as the concentration of electric field from occurring.

Moreover, the light shielding film 12 extends not only just below the active layer of the TFT but also extends to a peripheral portion around the active layer as shown by the margin 48. This constitution prevents the TFT from being irradiated by the light incident to the TFT from the substrate 31 side. The distance indicated with the numeral 48 corresponds to the thickness of the nitride 28 shown in FIG. 2.

Also, the phosphorous doped silicon film 12 not only functions as a light shield but also functions as a gettering means with respect to impurities. The regions other than the active layer is rendered light-transmittable by nitriding. Accordingly, the TFT can be maintained isolated from light while transmitting the light through the other regions.

In the case of implanting oxygen into the phosphorous doped silicon film 12 in place of nitrogen, the implanted portion of the silicon film becomes a transparent PSG. Also, in the case of using a mixture of oxygen and nitrogen, the implanted portion becomes transparent nitrided silicon oxide. (SiON)

EXAMPLE 2

Referring to FIGS. 3A–3D, the manufacturing steps of a TFT in accordance with a second example of the invention will be descried. An aluminum film 32 is formed on a glass substrate 31 by sputtering to a thickness of 500 Å (generally in the range of from 200 to 1,000 Å, and a silicon oxide film 33 is formed further thereon by sputtering to a thickness of 500 Å (generally in the range of from 200 to 800 Å). An amorphous silicon film 34 is formed thereon by plasma CVD to a thickness of 1,000 Å, and is crystallized thereafter by subjecting it to thermal annealing at 600° C. for a duration of 24 hours. A silicon oxide film 35 is formed further thereon by sputtering to a thickness of 500 Å, and an aluminum film 36 is formed thereon to a thickness of 1,000 Å also by sputtering to form a resist 30. The aluminum film 36 and the silicon oxide film 35 are patterned using this resist 30 to obtain a structure as shown in FIG. 3A.

Referring to FIG. 3B, nitrogen or oxygen ions, for example, nitrogen ions (N+) in this case, are implanted into the shaded region 37. Thus, the region 37 is nitrided and the amorphous silicon film 34 is partly converted into a light-transmitting silicon nitride film. Naturally, the silicon oxide film 33 is also converted into a silicon oxynitride film and rendered light-transmittable. The aluminum film 32 also turns into a light-transmitting aluminum nitride (AlN) film. Conclusively, all the regions subjected to the ion implantation turn into light-transmitting regions. The same effects result by implanting oxygen ions in place of nitrogen ions because an aluminum oxide (e.g. $Al_2O_3$) film is obtained from an aluminum film. A mixture of oxygen and nitrogen may be used to form aluminum oxynitride. (AlON)

The resist 30, the aluminum film 36, and the silicon oxide film 35 are removed thereafter as shown in FIG. 3C. A silicon oxide film 46 is formed to a thickness of 1,000 Å by sputtering to provide a gate insulating film. A 6,000 Å thick aluminum film containing 1% silicon is formed and patterned to provide an aluminum gate electrode 38. An oxide film 39 is then formed by anodic oxidation to a thickness of 2,000 Å around the aluminum electrode 38 to obtain a structure as shown in FIG. 3C.

Then, source/drain regions 40 and 42, and a channel forming region 41 are formed in a self-aligned manner by implanting phosphorus ions by ion implantation. Then, annealing is effected by irradiating a laser beam or an intense light. The annealing can be effected most effectively by irradiating an infrared light at a wavelength region of from 0.5 to 5 µm, preferably about 1.3 µm. The dangling bonds and defects in the silicon film can be removed efficiently by irradiating an infrared radiation, because infrared radiation can be selectively absorbed by the silicon film without considerably elevating the temperature of the glass substrate.

An inter layer insulator 43 is formed thereafter, and after perforating the holes therethrough, electrodes as source/drain electrodes 44 and 46 are formed to obtain a complete TFT as shown in FIG. 3D.

A phosphorus-doped silicon film or an aluminum film was used as the light shield layer in the examples above. However, a titanium film may be used as a titanium oxide film or a titanium nitride film by implanting therein nitrogen or oxygen ions. Titanium oxide is light transmitting, but titanium nitride is opaque and cannot be use in the pixel portions.

Similarly, other metals or metal suicides or a laminate of metal and silicon can be used as the light-shielding layer. For example, Mo, Ta and W may be used as such a metal. It is also possible to add silicon into the metal at 0.1–30 atomic %.

As described in the foregoing, a highly reliable TFT can be obtained by using a phosphorous doped silicon film or an aluminum film as the light shield layer and further imparting light-transmitting properties to the light-transmitting portions of the film by implanting nitrogen or oxygen ions therein.

Figure 4:
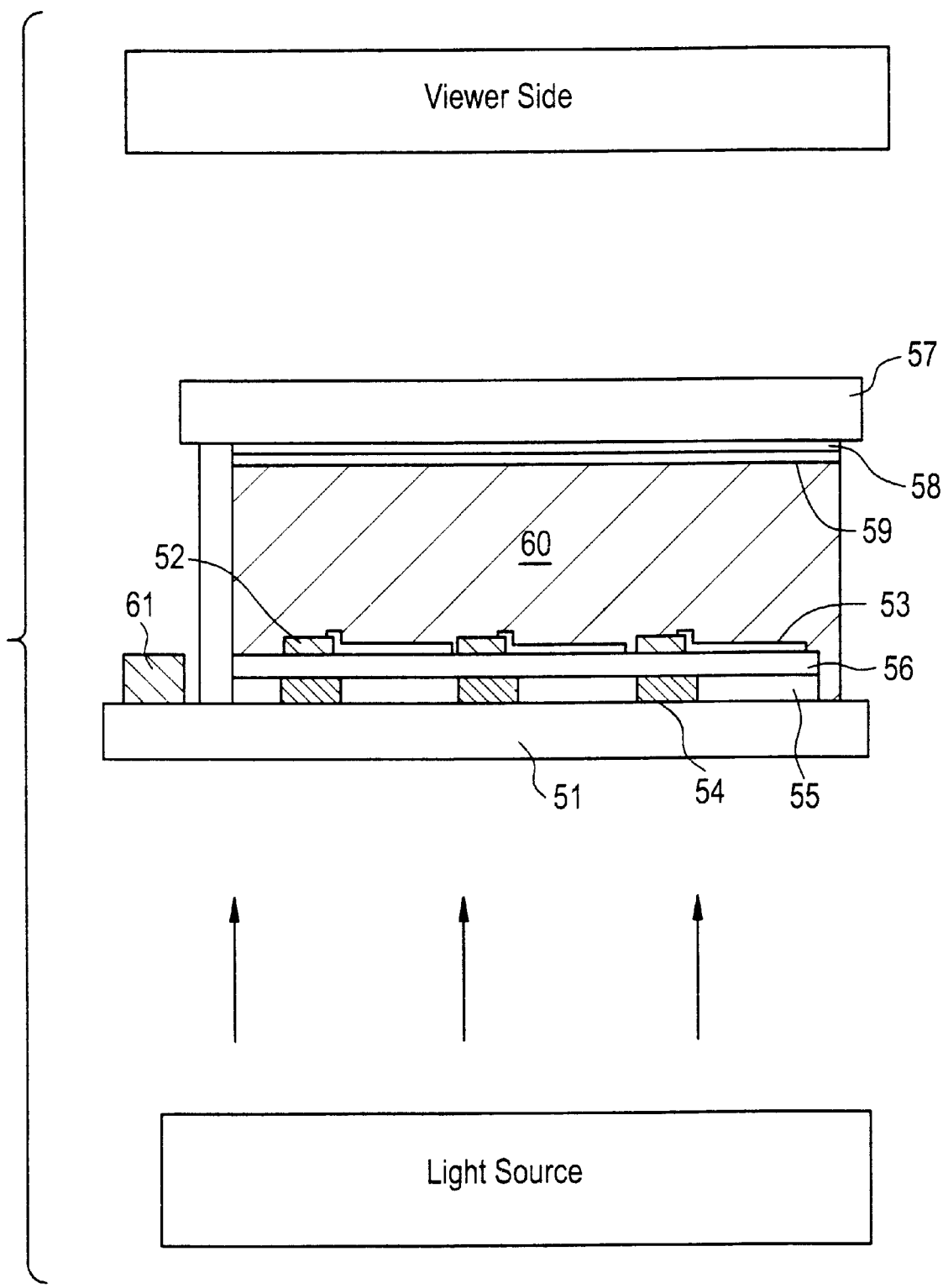
FIG. 4 is a cross sectional view of a liquid crystal device utilizing TFTs as switching elements of pixels, employing the present invention.

FIG. 4 shows a cross-sectional view of a liquid crystal device utilizing TFTs as a switching element of a pixel, employing the present invention. In the figure, thin film transistors are provided on a transparent substrate 51 in accordance with the present invention. Reference numeral 52 indicates a thin film transistor generally. Each transistor is connected with a pixel electrode 53 comprising a transparent conductive film such as indium tin oxide. The liquid crystal device includes a number of pixel electrodes 53 in the form a matrix. On the transparent substrate 51 and under the transistors is formed a phosphorous doped amorphous silicon film 54 in accordance with the present invention. The portion of the silicon film which locates under the pixel electrodes has been changed to a transparent silicon oxide or silicon nitride film 55 upon oxidation or nitridation. There is also provided a silicon oxide film 56 between the transistors and the underlying silicon film as shown in the figure. Reference numeral 61 denotes a driver circuit which is directly or indirectly formed on the substrate 51.

A known liquid crystal layer 60 such as a TN, STN or ferroelectric liquid crystal layer is interposed between the transparent substrate 51 and a counter substrate 57 having a counter electrode 58 and an orientation control film 59 formed thereon.

A light source is located on the side of the substrate 51 having the thin film transistors 52. Thus, the light enters from the substrate 51 and is modified by the liquid crystal layer 60. The modified light is seen from the side of the substrate 57. The phosphorous doped silicon 54 prevents the light from entering into the active semiconductor layer of thin film transistors. Accordingly, the liquid crystal device employing the present invention has a high reliability with respect to incident light. Of course, the liquid crystal device can be used as a display which is directly seen by a user or as a projector in which the light modified by the liquid crystal is projected onto a screen. Further, polarizing plates are located on the path of the light appropriately.

While the invention has been described in detail with reference to specific embodiments thereof, it will be apparent to one skilled in the art that various changes and modifications can be made therein without departing from the spirit and scope thereof. For example, the semiconductor device in accordance with the present invention should not be limited to the particular type of the TFT disclosed in the embodiments of the invention. Rather, any other type of thin film transistors such as an inverted coplaner type, a staggered type and an inverted staggered type may be used. Also, thin film diodes may be used instead of thin film transistors.

What is claimed is:

1. A semiconductor device comprising:

a transparent substrate;

a first layer formed over said transparent substrate, said first layer having at least a first portion and a second portion contiguous to said first portion;

a second layer comprising silicon oxide formed on said first layer;

a thin film transistor located over the first portion of said first layer, said thin film transistor including at least a semiconductor film comprising silicon, a gate insulating film adjacent to said semiconductor film and a gate electrode adjacent to said gate insulating film;

a pixel electrode connected with said thin film transistor;

a counter substrate having a counter electrode and an orientation control film formed thereon; and a liquid crystal layer interposed between said transparent substrate and said counter substrate, wherein said semiconductor film has at least a source region, a drain region and a channel region, wherein said first portion functions as a light shielding film to shield at least said channel region against light passing through said transparent substrate while said second portion is transparent, and wherein said first layer comprises a metal selected from the group consisting of Al, Ti, Mo, Ta and W.

2. A semiconductor device according to claim 1 wherein said semiconductor device is used in a liquid crystal device.

3. A semiconductor device according to claim 1 wherein said semiconductor device is used in an electro-optical device.

4. A semiconductor device according to claim 1 wherein a thickness of said first layer is 200 to 1000 Å.

5. A semiconductor device according to claim 1 wherein said first layer further comprises silicon.

6. A semiconductor device according to claim 1 wherein said first portion shields an interface between said source region and said channel region and an interface between said drain region and said channel region against said light.

7. A semiconductor device comprising:

a transparent substrate;

a first layer formed over said transparent substrate, said first layer having at least a first portion and a second portion contiguous to said first portion;

a second layer comprising silicon oxide formed on said first layer;

a thin film transistor located over the first portion of said first layer, said thin film transistor including at least a semiconductor film comprising silicon, a gate insulating film adjacent to said semiconductor film and a gate electrode adjacent to said gate insulating film;

a pixel electrode connected with said thin film transistor;

a counter substrate having a counter electrode and an orientation control film formed thereon; and a liquid crystal layer interposed between said transparent substrate and said counter substrate;

wherein said semiconductor film has at least a source region, a drain region and a channel region, wherein said first portion functions as a light shielding film to shield at least said channel region against light passing through said transparent substrate while said second portion is transparent, and wherein said first layer comprises a metal silicide selected from the group consisting of molybdenum silicide, tantalum silicide and tungsten silicide.

8. A semiconductor device according to claim 7 wherein said semiconductor device is used in a liquid crystal device.

9. A semiconductor device according to claim 7 wherein said semiconductor device is used in an electro-optical device.

10. A semiconductor device according to claim 7 wherein said metal silicide comprises silicon of 0.1–30 atomic %.

11. A semiconductor device according to claim 7 wherein a thickness of said first layer is 200 to 1000 Å.

12. A semiconductor device according to claim 7 wherein said first portion shields an interface between said source region and said channel region and an interface between said drain region and said channel region against said light.

13. A semiconductor device comprising:

a transparent substrate;

at least a first layer formed over said transparent substrate, said first layer having at least a first portion and a second portion contiguous to said first portion;

a second layer comprising silicon oxide formed on said first layer; and at least a first thin film transistor and a second thin film transistor located over said first layer, wherein each of said first thin film transistor and said second thin film transistor has at least a semiconductor film comprising silicon, a gate insulating film adjacent to said semiconductor film and a gate electrode adjacent to said gate insulating film, wherein two pixel electrodes are connected to said first thin film transistor and said second thin film transistor respectively, wherein said semiconductor film has at least a source region, a drain region and a channel region, wherein said first layer comprises a metal selected from the group consisting of Al, Ti, Mo, Ta and W, and wherein said first portion functions as a light shielding film to shield at least said channel region against light passing through said transparent substrate while said second portion is transparent.

14. A semiconductor device according to claim 13 wherein said semiconductor device is used in a liquid crystal device.

15. A semiconductor device according to claim 13 wherein said semiconductor device is used in an electro-optical device.

16. A semiconductor device according to claim 13 wherein a thickness of said first layer is 200 to 1000 Å.

17. A semiconductor device according to claim 13 wherein said first layer further comprises silicon.

18. A semiconductor device according to claim 13 wherein said first layer shields an interface between said source region and said channel region and an interface between said drain region and said channel region against said light.

19. A semiconductor device comprising:

a transparent substrate;

at least a first layer formed over said transparent substrate, said first layer having at least a first portion and a second portion contiguous to said first portion;

a second layer comprising silicon oxide formed on said first layer; and at least a first thin film transistor and a second thin film transistor located over said first layer;

wherein each of said first thin film transistor and said second thin film transistor has at least a semiconductor film comprising silicon, a gate insulating film adjacent to said semiconductor film and a gate electrode adjacent to said gate insulating film, wherein two pixel electrodes are connected to said first thin film transistor and said second film transistor respectively, wherein said semiconductor film has at least a source region, a drain region and a channel region, wherein said first layer comprises a metal silicide selected from the group consisting of molybdenum silicide, tantalum silicide, and tungsten silicide, wherein said first portion functions as a light shielding film to shield at least said channel region against light passing through said transparent substrate while said second portion is transparent.

20. A semiconductor device according to claim 19 wherein said semiconductor device is used in a liquid crystal device.

21. A semiconductor device according to claim 19 wherein said semiconductor device is used in an electro-optical device.

22. A semiconductor device according to claim 19 wherein said metal silicide comprises silicon of 0.1–30 atomic %.

23. A semiconductor device according to claim 19 wherein a thickness of said first layer is 200 to 1000 Å.

24. A semiconductor device according to claim 19 wherein said first layer shields an interface between said source region and said channel region and an interface between said drain region and said channel region against said light.

25. A semiconductor device comprising:

a transparent substrate;

at least a light shielding layer formed over said transparent substrate;

a layer comprising silicon oxide formed on said light shielding layer; and at least a first thin film transistor and a second thin film transistor located over said layer comprising silicon oxide;

wherein each of said first thin film transistor and said second thin film transistor has at least a semiconductor film comprising silicon, a gate insulating film adjacent to said semiconductor film and a gate electrode adjacent to said gate insulating film, wherein two pixel electrodes are connected to said first thin film transistor and said second thin film transistor respectively, wherein said semiconductor film has at least a source region, a drain region and a channel region, wherein said light shielding layer is located below at least said channel region and comprises a metal selected from the group consisting of Al, Ti, Mo, Ta and W, and wherein at least a portion of said light shielding layer comprises one of oxygen and nitrogen to be transparent.

26. A semiconductor device according to claim 25 wherein said semiconductor device is used in a liquid crystal device.

27. A semiconductor device according to claim 25 wherein said semiconductor device is used in an electro-optical device.

28. A semiconductor device according to claim 25 wherein a thickness of said light shielding layer is 200 to 1000 Å.

29. A semiconductor device according to claim 25 wherein said light shielding layer further comprises silicon.

30. A semiconductor device according to claim 25 wherein said light shielding layer is located below an interface between said source region and said channel region and an interface between said drain region and said channel region.

31. A semiconductor device comprising:

a transparent substrate;

at least a light shielding layer formed over said transparent substrate;

a layer comprising silicon oxide formed on said light shielding layer; and at least a first thin film transistor and a second thin film transistor located over said layer comprising silicon oxide;

wherein each of said first thin film transistor and said second thin film transistor has at least a semiconductor film comprising silicon, a gate insulating film adjacent to said semiconductor film and a gate electrode adjacent to said gate insulating film, wherein two pixel electrodes are connected to said first thin film transistor and said second thin film transistor respectively, wherein said semiconductor film has at least a source region, a drain region and a channel region, wherein said light shielding layer is located below at least said channel region and comprises a metal silicide selected from the group consisting of molybdenum silicide, tantalum silicide and tungsten silicide, and wherein at least a portion of said light shielding layer comprises one of oxygen and nitrogen to be transparent.

32. A semiconductor device according to claim 31 wherein said semiconductor device is used in a liquid crystal device.

33. A semiconductor device according to claim 31 wherein said semiconductor device is used in an electro-optical device.

34. A semiconductor device according to claim 31 wherein said metal silicide comprises silicon of 0.1–30 atomic %.

35. A semiconductor device according to claim 31 wherein a thickness of said light shielding layer is 200 to 1000 Å.

36. A semiconductor device according to claim 31 wherein said light shielding layer is located below an interface between said source region and said channel region and an interface between said drain region and said channel region.

37. A semiconductor device comprising:

a transparent substrate;

at least a first layer formed over said transparent substrate, said first layer having at least a first portion and a second portion;

a second layer comprising silicon oxide formed on said first layer; and at least a first thin film transistor and a second thin film transistor located over said second layer;

wherein each of said first thin film transistor and said second thin film transistor has at least a semiconductor film comprising silicon, a gate insulating film adjacent to said semiconductor film and a gate electrode adjacent to said gate insulating film, wherein said semiconductor film has at least a source region, a drain region and a channel region, and wherein said first portion functions as a light shielding film to shield at least said channel region against light passing through said transparent substrate while said second portion is transparent.

38. A semiconductor device according to claim 37 wherein said first layer comprises phosphorus doped silicon.

39. A semiconductor device comprising:

a transparent substrate;

at least a light shielding layer formed over said transparent substrate;

a layer comprising silicon oxide formed on said light shielding layer; and at least a first thin film transistor and a second thin film transistor located over said layer comprising silicon oxide;

wherein each of said first thin film transistor and said second thin film transistor has at least a semiconductor film comprising silicon, a gate insulating film adjacent to said semiconductor film and a gate electrode adjacent to said gate insulating film, wherein two pixel electrodes are connected to said first thin film transistor and said second thin film transistor respectively, wherein said semiconductor film has at least a source region, a drain region and a channel region, wherein said light shielding layer is located below at least said channel region, wherein at least a portion of said light shielding layer comprises one of oxygen and nitrogen to be transparent.

40. A semiconductor device according to claim 39 wherein said light shielding layer comprises phosphorus doped silicon.

* * * * *